(12) United States Patent
Moore et al.

(10) Patent No.: US 8,610,033 B1
(45) Date of Patent: Dec. 17, 2013

(54) RAPID THERMAL PROCESS REACTOR UTILIZING A LOW PROFILE DOME

(75) Inventors: Gary M. Moore, San Francisco, CA (US); Katsuhito Nishikawa, Oakdale, CA (US); Steven C. Beese, Tracy, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 925 days.

(21) Appl. No.: 11/731,207

(22) Filed: Mar. 29, 2007

(51) Int. Cl.
F27B 5/14 (2006.01)
H01L 21/67 (2006.01)
F27B 17/00 (2006.01)

(52) U.S. Cl.
CPC .... H01L 21/67109 (2013.01); H01L 21/67115 (2013.01); *F27B 17/0025* (2013.01)
USPC .......................... 219/390; 219/405; 392/416

(58) Field of Classification Search
USPC .......... 219/390, 392, 396; 118/715, 725, 728, 118/729
See application file for complete search history.

(56) References Cited

U.S. PATENT DOCUMENTS

| | | | | |
|---|---|---|---|---|
| 5,085,887 A | * | 2/1992 | Adams et al. | 427/585 |
| 5,437,757 A | * | 8/1995 | Rice et al. | 156/345.51 |
| 5,444,217 A | * | 8/1995 | Moore et al. | 219/405 |
| 5,580,388 A | | 12/1996 | Moore | 118/728 |
| 5,683,518 A | | 11/1997 | Moore et al. | 118/730 |
| 5,710,407 A | | 1/1998 | Moore et al. | 219/405 |
| 5,802,099 A | | 9/1998 | Curran et al. | 374/131 |
| 5,820,686 A | | 10/1998 | Moore | 118/730 |
| 6,110,289 A | * | 8/2000 | Moore | 118/725 |
| 6,163,015 A | | 12/2000 | Moore et al. | 219/404 |
| 6,169,244 B1 | | 1/2001 | Carlos et al. | 136/201 |
| 6,213,478 B1 | | 4/2001 | Nishikawa | 279/4.08 |
| 6,310,327 B1 | | 10/2001 | Moore et al. | 219/405 |
| 6,328,221 B1 | | 12/2001 | Moore et al. | 239/1 |
| 6,347,749 B1 | | 2/2002 | Moore et al. | 239/1 |
| 6,592,675 B2 | | 7/2003 | Nishikawa | 118/730 |
| 6,869,485 B2 | * | 3/2005 | Halpin | 118/725 |
| 2001/0015344 A1 | * | 8/2001 | Rossman | 216/67 |
| 2004/0173314 A1 | * | 9/2004 | Nishio et al. | 156/345.33 |

OTHER PUBLICATIONS

U.S. Appl. No. 11/254,294, entitled "Gas Ring and Method of Processing Substrates", of Katsuhito Nishikawa, Gary M. Moore and Aaron David Ingles, filed on Oct. 19, 2005.

* cited by examiner

*Primary Examiner* — Henry Yuen
*Assistant Examiner* — Thien S Tran
(74) *Attorney, Agent, or Firm* — Forrest Gunnison

(57) ABSTRACT

A rapid thermal process reactor includes a vessel having a dome assembly. The vessel bounds a reactor chamber for rapid thermal processing of one or more substrates. The dome assembly includes a low profile dome and a flange surrounding and abutting the low profile dome. The flange includes a top surface; a bottom surface, removed from and opposite the top surface; an outer circumferential edge surface connecting the top surface and the bottom surface; and an inner edge surface, opposite and removed from said outer circumferential edge, including a portion abutting said low profile dome. The rapid thermal process reactor also includes a radiant heat source; a gas ring mounted about a sidewall of the vessel; a gas ring shield mounted as part of the sidewall of the vessel; a clamp ring to clamp the dome assembly in place; and a clamp ring shield mounted on the clamp ring.

16 Claims, 6 Drawing Sheets

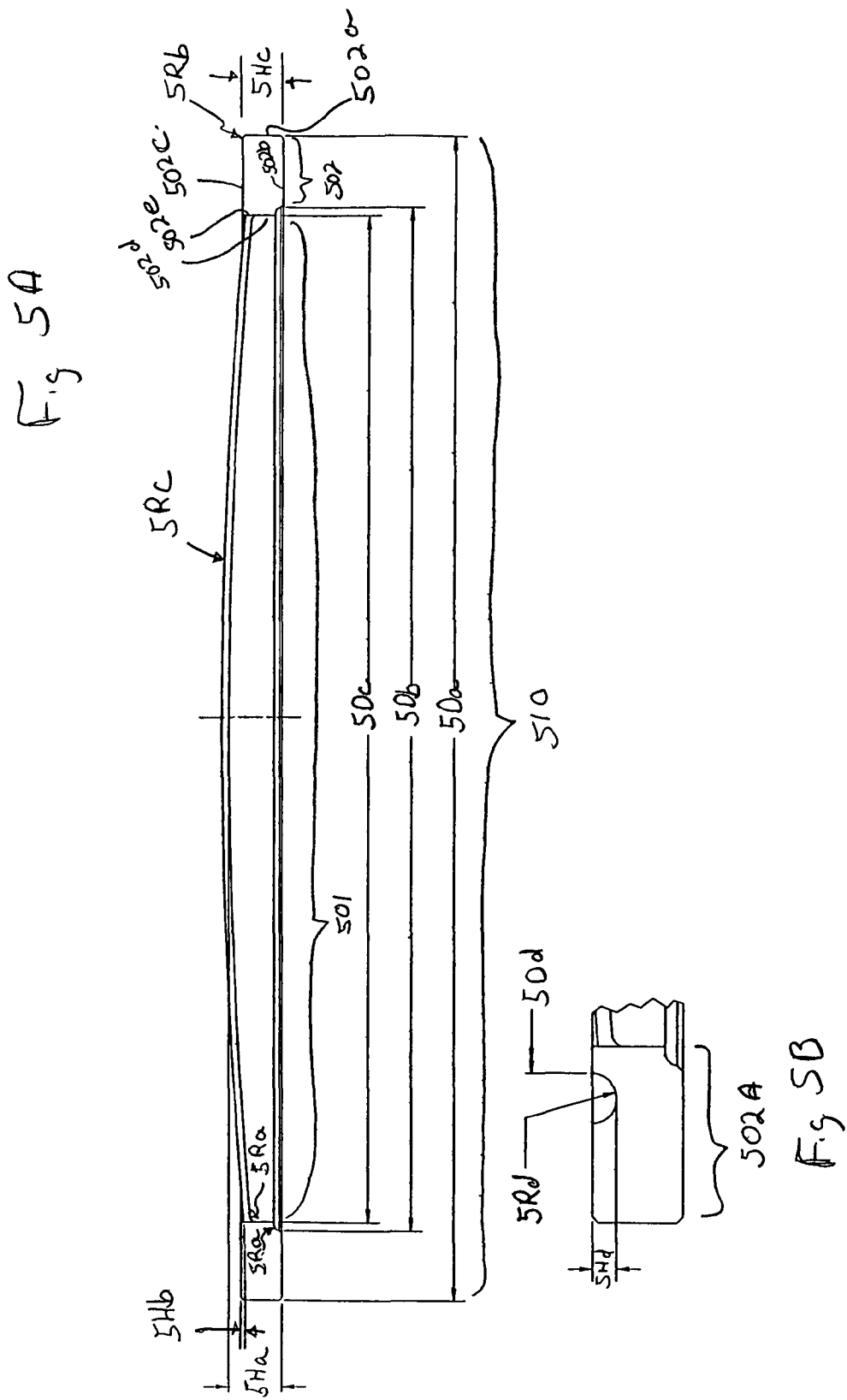

RAPID THERMAL PROCESS REACTOR UTILIZING A LOW PROFILE DOME

BACKGROUND OF THE INVENTION

1. Field of the Invention

The present invention relates generally to substrate processing reactors, and more particularly to rapid thermal process reactors with a low profile dome.

2. Description of Related Art

FIG. 1 is a simplified cross-sectional view of RTP reactor 100 for processing one or more semiconductor substrates, e.g., substrates 111, 112. Reactor 100 included vessel 101, susceptor 102, susceptor support 104, radiant heat source 110 (including a plurality of lamps 105 and reflectors 106), passive heat distribution element 107, side inject gas jets 114a, 114b and gas exhaust pipes 109a, 109b.

Vessel 101 was formed by bottom wall 101a, sidewall 101b and domed top wall 101c. Walls 101a, 101b and 101c bounded reaction chamber 103. Bottom wall 101a and sidewall 101b were made of stainless steel and lined with quartz. In one embodiment, bottom wall 101a was circular and sidewall 101b was cylindrical. Dome-shaped top wall 101c was made of quartz so that relatively little of the radiant energy from radiant heat source 110 was absorbed by top wall 101c. Thus, the radiant energy passed through top wall 101c unimpeded to directly heat substrates 111, 112.

The shape of top wall 101c was chosen as a compromise between several factors. As top wall 101c was made increasingly flat, the possibility increased that top wall 101c would collapse when reaction chamber 103 was held at a vacuum pressure, i.e., less than 100 torrs, for instance, during a reduced pressure BICMOS process.

On the other hand, as the curvature of top wall 101c was increased, radiant heat source 110 was moved increasingly further away from substrates 111, 112. Thus, a greater energy output from radiant heat source 110 was required to maintain a given temperature of substrates 111, 112.

Additionally, as the curvature of top wall 101c increased, the distance of top wall 101c from substrates 111, 112 also increased so that at least some portion of the process gases had a longer distance to descend. This portion of the process gases had a longer time to heat up before the gases were deposited on substrates 111, 112. Thus, the vertical temperature distribution of the process gases was not uniform across the reaction chamber. The curvature of top wall 101c also affected the flow of the process gases as they descended upon substrates 111, 112.

The exact shape of top wall 101c was empirically determined by testing a number of different shapes and one was chosen that yielded a desired combination of the above-identified characteristics. Upper wall 101c had a cross-sectional shape that formed an approximately circular arc. Top wall 101c had a characteristic height h between 3" and 6" inclusive.

Gas-deflecting shelf 173 sat on a quartz liner that was adjacent to side wall 101b in reaction chamber 103. Gas-deflecting shelf 173 was made of, for instance, quartz so that gas-deflecting shelf 173 disturbed the temperature distribution within susceptor 102 and the substrate or substrates as little as possible.

Gas-deflecting shelf 173 forced gases that might otherwise have passed between susceptor 102 and side wall 101b of the reactor to flow over surface 102a of susceptor 102 (and, thus, the substrate or substrates), when susceptor 102 was in the processing position as shown by the dashed lines in FIG. 1. Gas-deflecting shelf 173 also caused an increase in velocity of gases near the edge of susceptor 102 because a smaller opening existed between susceptor 102 and gas-deflecting shelf 173 than would exist between susceptor 102 and reactor sidewall 101b if gas-deflecting shelf 173 were not present. The length of gas-deflecting shelf 173 was varied to create an opening between gas-deflecting shelf 173 and susceptor 102 so as to obtain a gas flow that yielded the desired process uniformities.

Substrates 111, 112 (FIG. 1A) were mounted on circular susceptor 102 within reaction chamber 103. Susceptor 102, susceptor support 104 and passive heat distribution element 107 are shown in the loading position in FIG. 1. Substrates 111, 112 were placed into and removed from reaction chamber 103 by one of a robot or a substrate handling system (not shown) through a door formed in sidewall 101b. The loading position was chosen to allow the robot or substrate handling system to easily extend into reaction chamber 103 and place substrates 111, 112 on susceptor 102.

When susceptor 102 was in the loading position, pins (not shown) extend through corresponding holes formed in susceptor 102 to raise substrates 111, 112 above surface 102a. Alternatively, the pins extended through holes in susceptor 102 to raise a substrate surround ring upon which substrates 111, 112 rested. Any number of pins could be used to raise each substrate 111, 112 or substrate surround ring, though at least three were desirable to stably support a substrate, e.g., substrate 111, or substrate surround ring. For example one to eight pins are used. Since it was also generally desirable to minimize the number of pins used to minimize mechanical complexity, three pins, located 120° apart in the radial direction around susceptor 102, were used to support 125 mm (5 inches), 150 mm (6 inches) and 200 mm (8 inches) substrates, and four pins, located 90° apart, were used to support 250 mm (10 inches) and 100 mm (12 inches) substrates.

In one example, substrates 111, 112 were heated by a single heat source: radiant heat source 110. Radiant heat source 110 included plurality of lamps 105 that emitted radiant energy having a wavelength in the range of less than 1 µm to about 500 µm, preferably in the range of less than 1 µm to about 10 µm, and most preferably less than 1 µm. A plurality of reflectors 106, one reflector adjacent each lamp, reflected radiant energy toward substrates 111, 112.

Radiant heat source 110 was both water-cooled and forced-air cooled. The combination of water-cooling and forced-air cooling kept lamps 105 and reflectors 106 within the required operating temperature range.

In reactor 100 (FIG. 1), passive heat distribution element 107 was mounted beneath susceptor 102 in proximity to susceptor 102. As used herein, "proximity" means as close as possible considering the limitations imposed by the physical space requirement for connecting susceptor 102 to susceptor support 104. Passive heat distribution element 107 minimized heat losses from susceptor 102, which, in turn, minimized heat losses from substrates 111, 112. Passive heat distribution element 107 was preferably made of a material that either absorbs and re-radiates heat toward susceptor 102, or that reflected heat toward susceptor 102.

SUMMARY OF THE INVENTION

According to one embodiment of the invention, a rapid thermal process reactor includes a vessel having a dome assembly. The vessel bounds a reaction chamber for rapid thermal processing of one or more substrates. The dome assembly includes a low profile dome and a flange surrounding and abutting the low profile dome.

The flange includes a top surface; a bottom surface, removed from and opposite the top surface; an outer circumferential edge surface connecting the top surface and the bottom surface; and an inner edge surface, opposite and removed from the outer circumferential edge, including a portion abutting the low profile dome. In one embodiment the portion abutting the low profile dome is positioned about adjacent to the top surface. In another embodiment, the portion abutting the low profile dome is positioned about adjacent to the bottom surface.

The rapid thermal process reactor also includes a radiant heat source mounted outside the vessel so radiant energy from the radiant heat source passes through the low profile dome into the vessel to heat the substrate or substrates in the reaction chamber. A gas ring is mounted about a sidewall of the vessel. A gas ring shield is mounted as part of the sidewall of the vessel to shield the gas ring from the reaction chamber. A clamp ring is used to clamp the dome assembly in place. A clamp ring shield is mounted on the clamp ring.

In one embodiment, the bottom surface of the flange includes a notch surface bounding a notch in the flange. The gas ring shield further includes a lip extending into the notch.

BRIEF DESCRIPTION OF THE DRAWINGS

FIG. 5A is a cross sectional view of another embodiment of the dome assembly of this invention.

FIG. 5B is a cross sectional view of an optional flange for the dome assembly of FIG. 5A.

In the drawings and following Detailed Description, elements with the same reference numeral are the same or equivalent elements. The first digit of a reference numeral is the figure number of the figure in which the element with that reference numeral first appeared.

DETAILED DESCRIPTION

Figure 1:
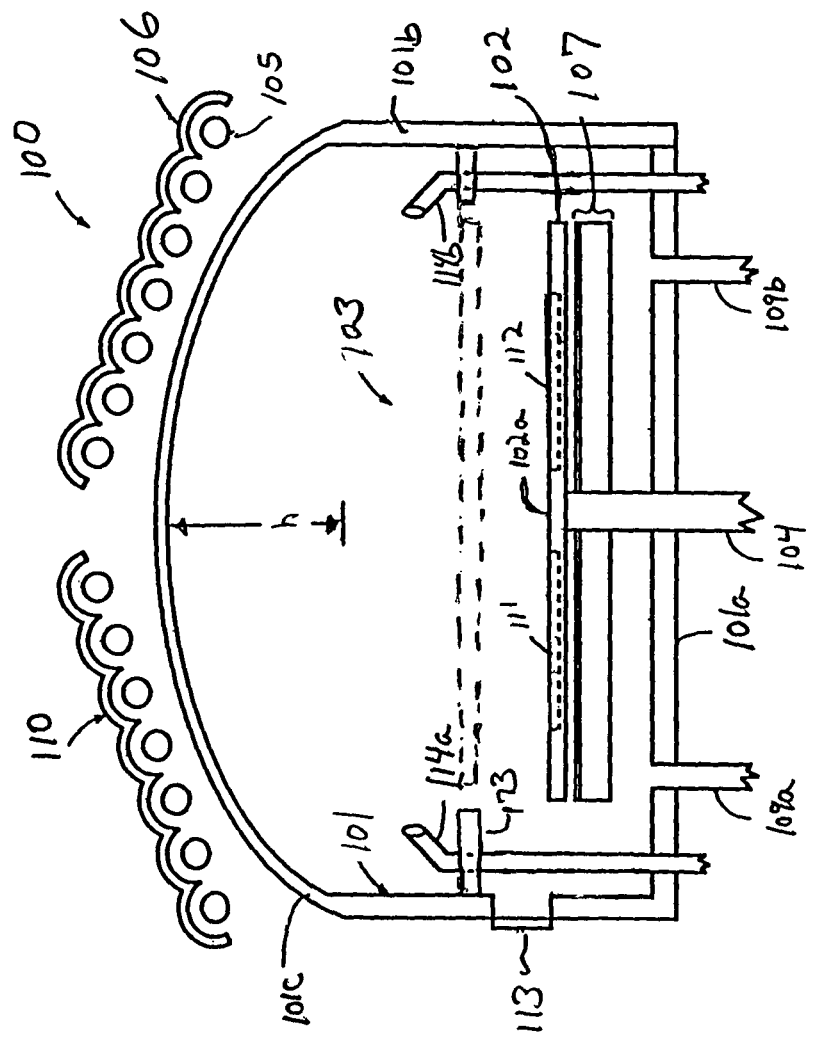
FIG. 1 is a simplified cross-sectional view of a prior reactor with a high profile dome in which wafers are heated with a single heat source and process gases are side-injected into the reaction chamber.
Figure 2:
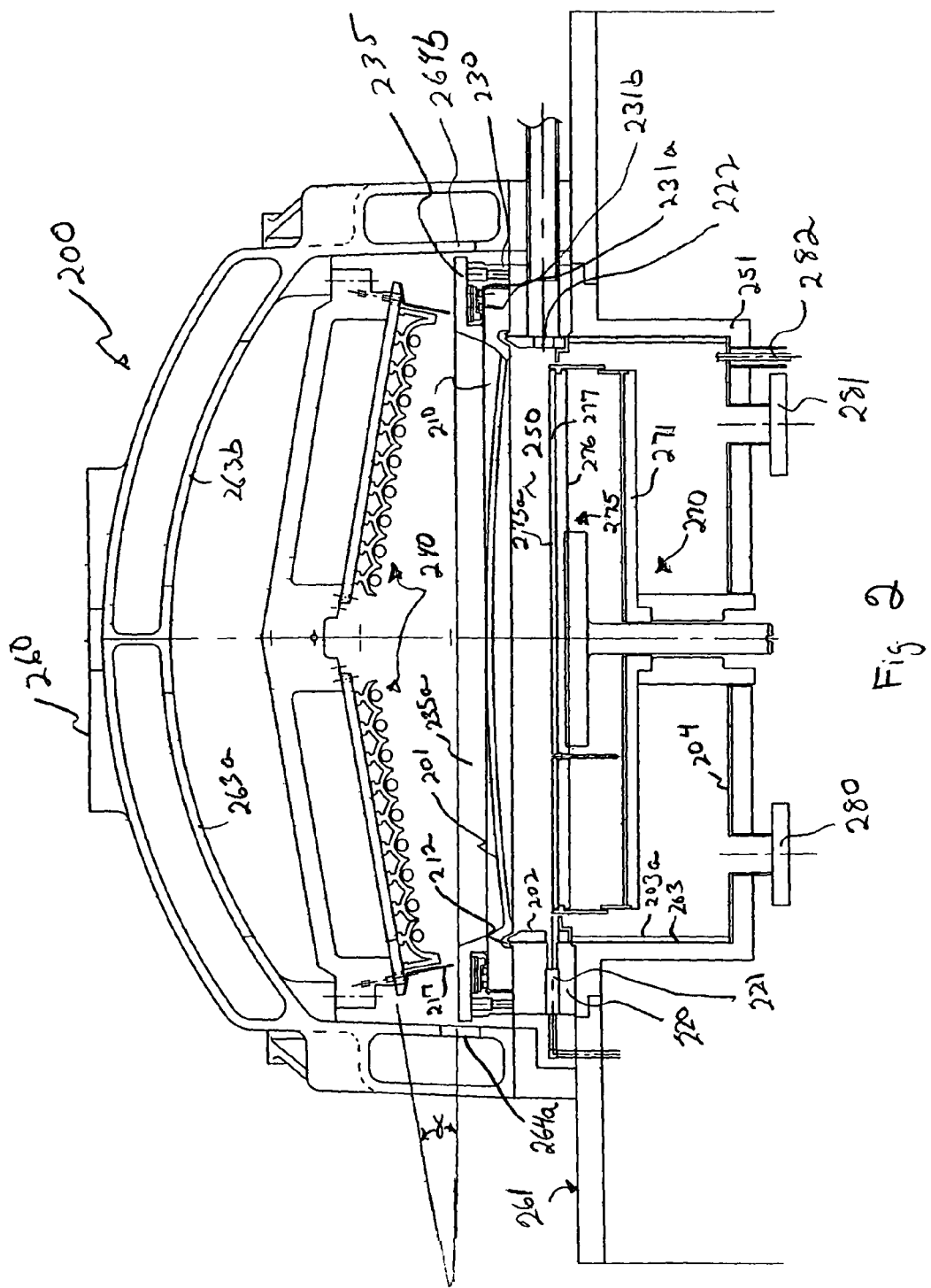
FIG. 2 is a cross-sectional view of a rapid thermal processing reactor with a low profile dome according to one embodiment of this invention.
Figure 3A:
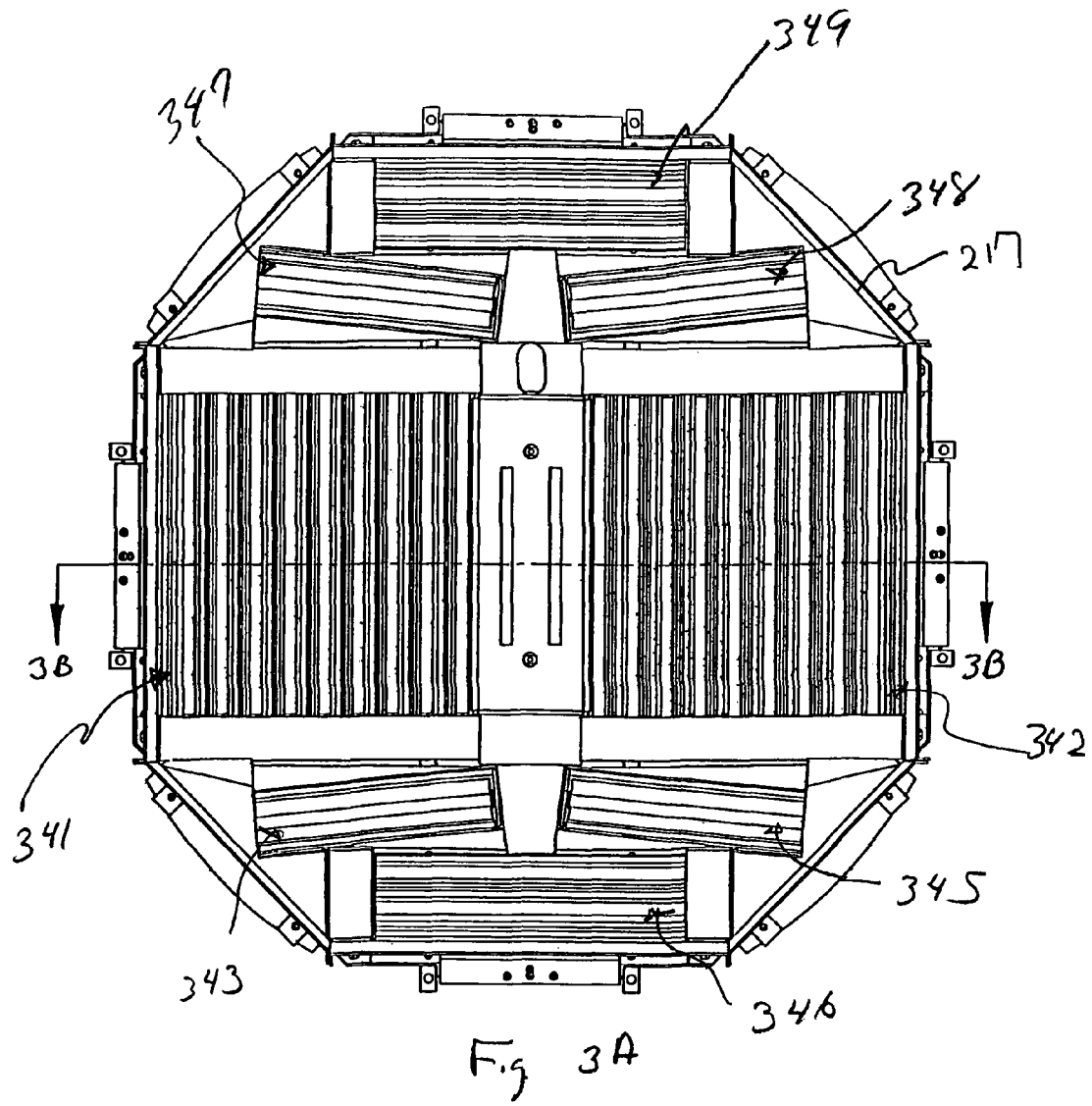
FIG. 3A is a bottom view of one embodiment of the radiant heat source of FIG. 2.
Figure 3B:
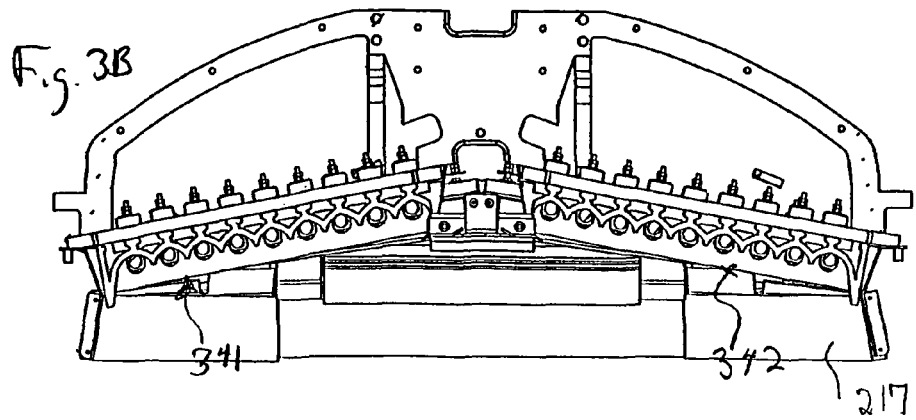
FIG. 3B is a cross-sectional view of the radiant heat source of FIG. 3A taken along section 3A-3A of FIG. 3A.
Figure 3C:
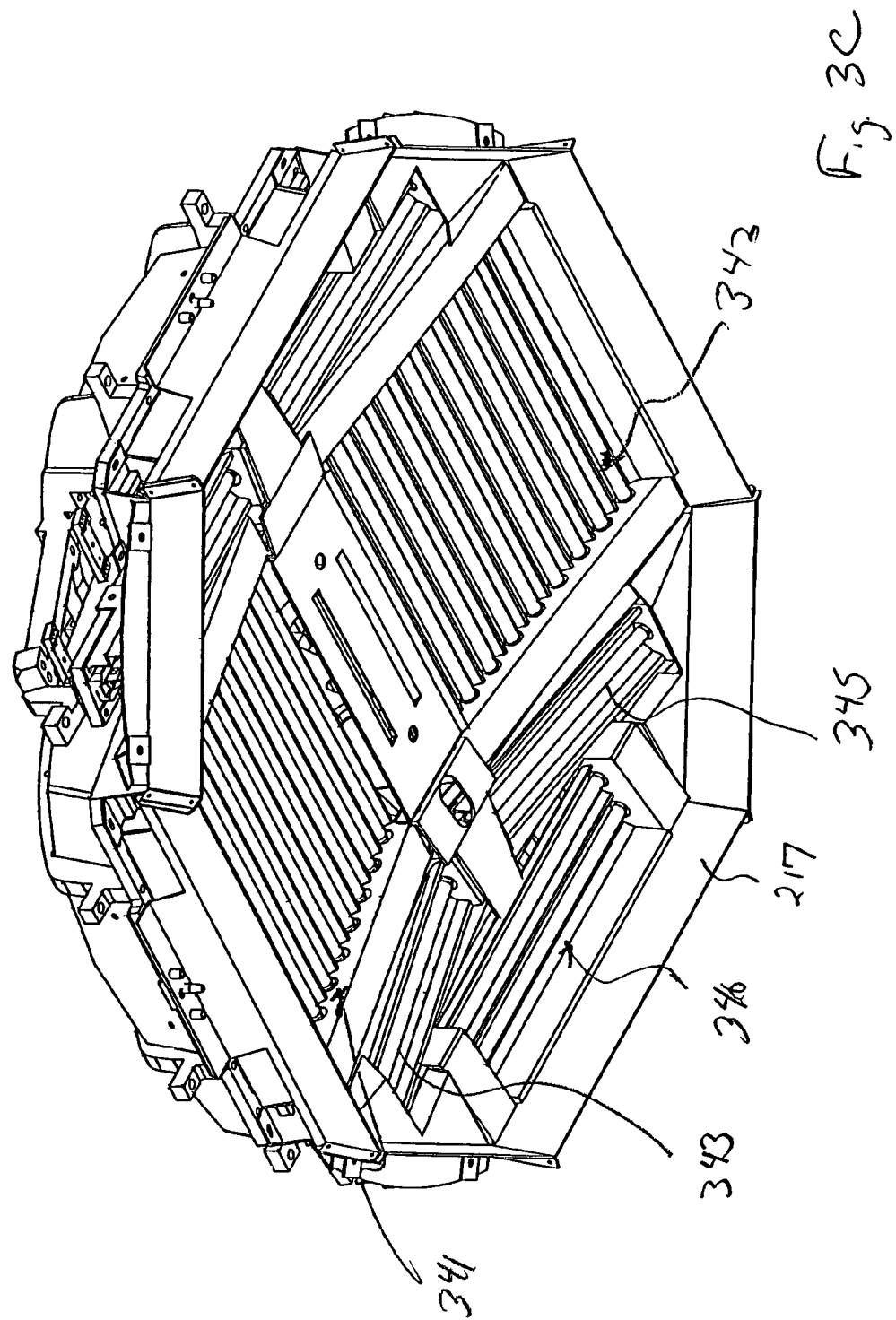
FIG. 3C is a perspective view of the radiant heat source of FIG. 3A.

In one embodiment, a low profile dome 201 is used in rapid thermal process (RTP) reactor 200. Unexpectedly, low profile dome 201 provides better performance characteristics than RTP reactors with a high profile dome, i.e., a dome with a height in the range of 3" to 6" as in the prior art RTP reactors. Further, low profile dome 201 has sufficient strength that dome 201 does not shatter when RTP reactor 200 is evacuated for processing.

As used herein, a low profile dome is a dome transparent to radiant energy that has a height selected from the range of 0.25 inches to 1.50 inches and is used as a wall for a rapid thermal process reactor. Also, as used herein, a rapid thermal process (RTP) reactor is a reactor that rapidly heats substrates to an elevated temperature to perform relatively short processes, typically less than a few minutes long. RTP reactor 200 heats the substrate or substrates at a rate between 10° C./sec and 400° C./sec and in one embodiment about 20° C./sec.

Low profile dome 201 in combination with gas ring 220 improves gas flow over a substrate or substrates mounted on susceptor 275 and so results in better uniformity of a deposited layer on the substrate. The reduction in height of reaction chamber 250 associated with low profile dome 201 provides more efficient heating because radiant heat source 240 is in closer proximity to the substrates being processed. Low profile dome 201 reduces the volume of reaction chamber 250 relative to prior art RTP reactors. The reduced height of low profile dome 201 means that the process gases have a more uniform temperature distribution than could be obtained in the prior art RTP reactors described above.

In this embodiment, low profile dome 201 bounds a top of a reaction chamber 250 within vessel 251. Bottom wall 204, sidewall 203, gas ring liner 202 and low profile dome 201 form vessel 251. Walls 201 to 204, i.e., vessel 251, bound reaction chamber 250.

Bottom wall 204 and sidewall 203 are made of stainless steel and lined with quartz. In one embodiment, bottom wall 204 is circular and sidewall 203 is cylindrical. Low profile dome 201 is clear transparent quartz and is part of a dome assembly 210. Low profile dome 201 is made of transparent quartz so that relatively little of the radiant energy from radiant heat source 240 is absorbed by low-profile dome 201.

As shown in FIGS. 2 and 3A to 3C, radiant heat source 240 includes a plurality of lamp banks 341 to 349. Plurality of lamp banks 341 to 349 are mounted to and within a shell 260 and are mounted above low profile dome 201 outside reaction chamber 250.

Reflector 217 (FIGS. 2, and 3A to 3C) is mounted to the assembly holding radiant heat source 240. In one embodiment, reflector 217 is made of a plurality of pieces of sheet metal, e.g., stainless steel. (See FIGS. 3A to 3C.) Each piece is plated with a reflective material such as gold, nickel or silver. Gold was used in one embodiment. Typically, the entire surface of reflector 217 is plated, though it is only necessary that the surface of reflector 217 facing into reaction chamber 250 be plated. Reflector 217 is attached around the entire periphery of reaction chamber 250 and is positioned so as to reflect energy toward susceptor 275.

A gas ring 220 is located on a tabletop 261, both of which in one embodiment are stainless steel. Gas ring 220 includes at least one gas ring injector 221 and at least one gas ring exhaust port 222. One embodiment of a gas ring suitable for use in this invention is presented in commonly assigned U.S. patent application Ser. No. 11/254,294, entitled "GAS RING AND METHOD OF PROCESSING SUBSTRATES," of Katsuhito Nishikawa, Gary M. Moore, and Aaron David Ingles filed on Oct. 19, 2005, which is incorporated herein by reference in its entirety.

A quartz stepped gas deflection shelf 271 is mounted between sidewall quartz liner 203a and gas ring liner 202. Thus, in this embodiment, gas ring 220 is mounted about reaction chamber 250 so that when susceptor 275 is in the processing position, a centerline of gas ring injector 221 is approximately tangent to a top surface 275a of susceptor 275.

Dome assembly 210 is mounted on gas ring 220. Dome assembly 210, and consequently low profile dome 201, is held in place by a clamp ring 230. A lip of gas ring liner 202 extends into a notch 212 formed in a ring portion, a flange, of dome assembly 210 that surrounds low profile dome 201. The extension of the lip of gas ring liner 202 into notch 212 acts to form a labyrinth seal, which in turn blocks any straight path for gas flow from reaction chamber 250 along the interface between gas ring 220 and dome assembly 210, in this embodiment.

Clamp ring 230 is made of stainless steel, in one embodiment. Two O-rings 231a, 231b are placed in grooves in clamp ring 230 so that when clamp ring 230 is tightened down with screws in the countersunk holes illustrated, O-rings 231a, 231b are compressed to form a seal between dome assembly 210 and clamp ring 230. In this embodiment, cooling water is passed through clamp ring 230 in the channels illustrated.

A clamp ring shield 235 sets on dome assembly 210 and an upper surface of clamp ring 230. In one embodiment, clamp ring shield 235 is made of opaque quartz and functions to shield clamp ring 235 from the radiant energy from radiant heat source 240. An inner circumferential edge surface 235a of clamp ring shield 235 has an angle so that a uniform beveled inner circumferential surface is formed with an inner circumferential beveled edge surface of dome assembly 210.

A rotatable susceptor assembly 270 is located within reaction chamber 250. In this embodiment, rotatable susceptor assembly 270 includes a two piece rotatable susceptor 275 that in turn includes a circular quartz susceptor support layer 276 and at least one substrate surround ring 277 mounted on susceptor support layer 276.

During processing, a substrate is supported by substrate surround ring 277. A plurality of lift pins is mounted in substrate surround ring 277 and extends through quartz susceptor support layer 276. (For convenience and to avoid cluttering FIG. 2, only a single graphite lift pin is illustrated.)

A circular quartz pin lift plate 271 is also fixedly mounted in rotatable susceptor assembly 270. Pin lift plate 271 does not rotate, but is moved up and down within reaction chamber 250. Susceptor support layer 276 also moves up and down within reaction chamber 250 and moves up and down relative to pin lift plate 271. Thus, when layer 276 is moved down relative to plate 271, support pins contact pin lift plate 271 and lift substrate surround ring 277 with a substrate above susceptor support layer 276. An example of a substrate support ring and heat distribution elements suitable for use in this invention are described in commonly assigned, U.S. Pat. No. 5,820,686, entitled "Multi-layer Susceptor for Rapid Thermal Process Reactors of Gary M. Moore, issued on Oct. 13, 1998, which is incorporated herein by reference in its entirety.

A first quartz skirt is attached to susceptor 275 and a second quartz skirt is attached to pin lift plate 271. The two skirts are sized so that there is not a straight path for gas flow from reaction chamber 250 into the region between susceptor 275 and pin lift plate 271.

Bottom wall 204 includes a chamber exhaust port 281 and an infrared port 281 for temperature sampling using a pyrometer for example. Bottom wall 204 also includes an opening in which a thermocouple 282 is mounted.

Each lamp bank in plurality of lamp banks 341 to 349 includes one or more lamps and a like number of reflectors, one for each lamp, formed integrally as reflector assemblies. Lamp banks 341 and 342 each have nine lamps. Lamp banks 343, 345, 347, 348, each have one lamp. Lamp banks 346, 349 each have two lamps. The cooling, lamp casing and other details of the construction of the plurality of lamp banks 341 to 349 is similar to the prior art lamp banks and so is not considered further. The lamp bank casings are made of, for instance, gold-plated stainless steel However, the orientation of the lamp banks is different from the prior art orientation of 20°. In this embodiment, the lamp banks are orientated at a characteristic angle α with respect to the horizontal, i.e., a line a parallel to tabletop 261, of 10°. This provides more direct heating of a substrate or substrates in reaction chamber 250.

The lamps are, for instance, quartz halogen lamps. A voltage is applied to each of lamps resulting in the heating of a tungsten filament to produce radiant energy in a short wavelength range, i.e., in the range of less than 1 μm to about 500 μm. Quartz halogen lamps, suitable for use with this invention, are sold by Ushio American, Inc. of Torrance, Calif. 90502 as model no. QIR 480-6000E. The specifications for these lamps are shown in Table 1.

TABLE 1

| Specification for Radiant Energy Lamps | | | | | |
|---|---|---|---|---|---|
| Design Volts (V) | Design Watts (W) | Color Temp (° K) | Maximum Overall Length (mm) | Maximum Light Length (mm) | Bulb Diameter (mm) |
| 480 | 6,000 | 3,150 | 300 | 248 | 11 |

In addition to water-cooling, the lamps and reflector assemblies in radiant heat source 240 are cooled by a flow of forced-air. Cool air enters a cavity formed in the top of shell 260 through air inlets 263a, 263b. The cool air passes from the cavity through radiant heat source 240 to the region between radiant heat source 240 and low profile dome 201. The air passes over and cools the reflector assemblies. The air then passes over low profile dome 201, cooling low profile dome 201.

The heated air exits through air outlets 264a, 265b formed in shell 260. The heated air is then returned to a heat exchanger, where the air is cooled. The cooled air is then recirculated back to the cavity in shell 260 above radiant heat source 240.

Figure 4:
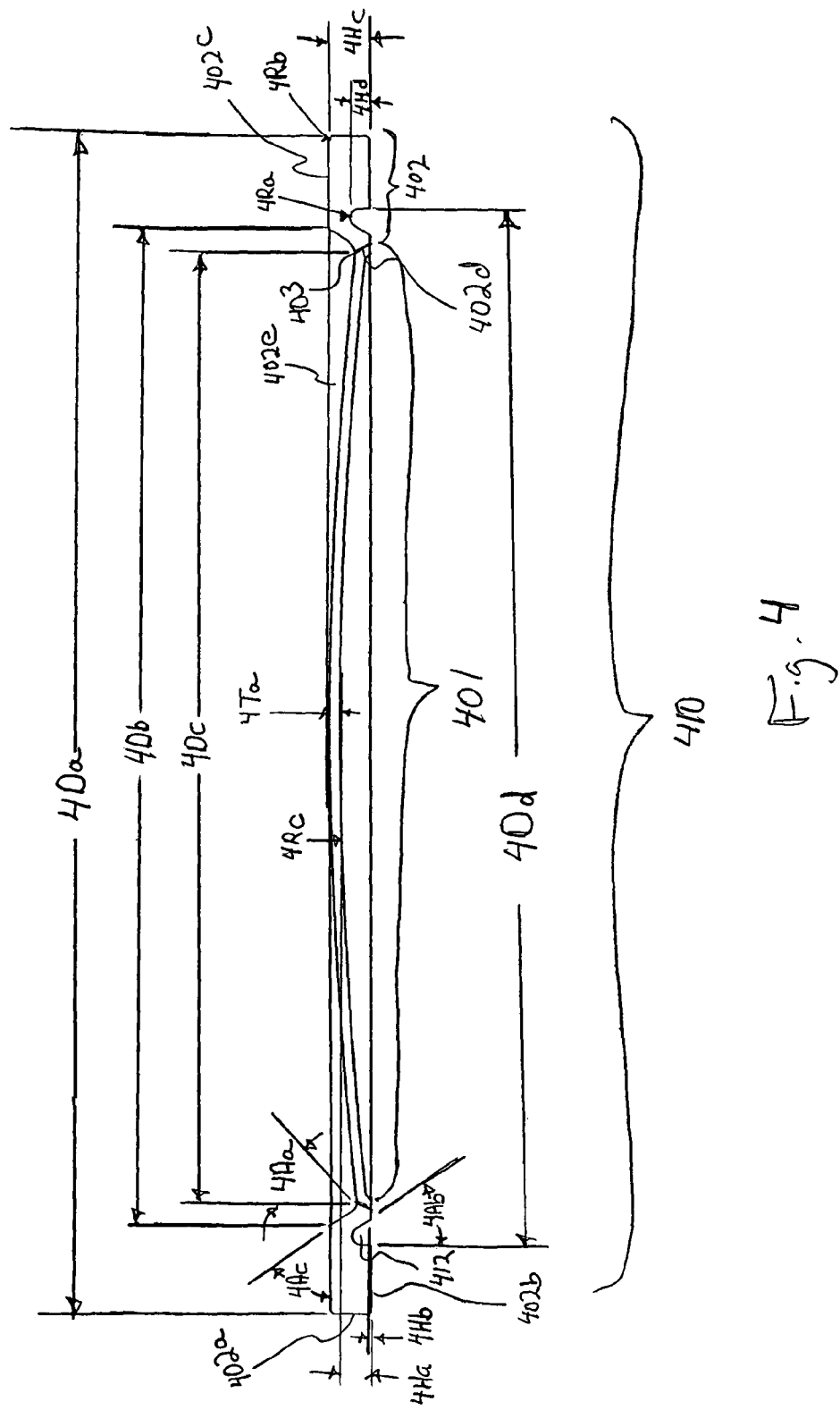
FIG. 4 is a cross sectional view of one embodiment of the dome assembly of this invention.

FIG. 4 is a more detailed example of one embodiment of dome assembly 410 with low profile dome 401. In this embodiment, low profile dome 401 is a first portion of dome assembly 410.

Dome assembly 410 also includes a flange 402, a second portion that is a ring portion, about low profile dome 401, i.e., flange 402 surrounds low profile dome 401. Flange 402 has an outer circumferential edge surface 402a—an outer wall—, a first planar edge surface, bottom surface 402b in this embodiment, and a second planar edge surface, top surface 402c in this embodiment, opposite to and removed from first planar surface 402b by a distance 4Hc. In one embodiment, bottom surface 402b has a fine grind finish or better with fire polish.

An inner edge surface 402d, a portion of an inner wall, of the flange 402 abuts an edge surface of low profile dome 401. Inner edge surface 402d extends from a raised portion of bottom surface 402b a distance equal to about the thickness of low profile dome 401. Thus, low profile dome 401 is said to be positioned along an inner sidewall of flange 402 about adjacent to a bottom surface of flange 402. A bevel edge surface 402e of flange 402 extends from an edge 403 formed by the intersection of low profile dome 401 with flange 402 to top surface 402c at an angle 4Ac.

Bottom surface 402b includes a notch surface bounding a notch 412 in flange 402. As described above, a lip of gas ring liner 220 extends into notch 412.

First portion 401 is clear quartz. Low profile dome 401 is made of clear quartz so that relatively little of the radiant energy from radiant heat source is absorbed by low profile dome 401. This allows most of the radiant energy to be transmitted through reaction chamber 250 directly to at least one substrate on susceptor 275.

Flange 402 is made of heat shielding opaque quartz. A heat shielding opaque quartz suitable for use in this invention is available from Pyromatics Corp., 3985 Ben Hur Ave., Willoughby, Ohio 44094-6365 USA as Model No. LD-80

Low profile dome 401 is a portion of a sphere having a radius 4RC above a chord having a length 4Dc, which is the diameter of low profile dome 401. In this embodiment, a height of low profile dome 201 is defined as a distance 4Ha from bottom surface 402b of flange 402 to the highest point of an inner surface of low profile dome 401. A height of low profile dome 401 may be selected from a range of 0.25 inches to 1.5 inches and in the embodiment of Table 2 is 0.51 inches.

Table 2 presents dimensions for one embodiment of dome assembly 410. All burrs and sharp edges are removed from dome assembly 410. All dimensions and tolerances are interpreted per ASME Y14.5M-1994. In this embodiment, the top and bottom surfaces have a flatness of 0.005 in. (0.13 mm) and a parallelism of 0.010 in. (0.25 mm).

TABLE 2

| Ref. No. | Dimension | |
|---|---|---|
| 4Da | 26.000 in. ± 0.010 in. (659.4 mm ± 0.3 mm) | |
| 4Db | 22.01 in. ± 0.02 in. (558.2 mm ± 0.5 mm) | |
| 4Dc | 20.998 in. ± 0.005 in. (532.5 mm ± 0.1 mm) | |
| 4Dd | 22.875 in. ± 0.010 in. (580.1 mm ± 0.3 mm) | |
| 4Ha | 0.51 in. (12.9 mm) | +0.18 in. (4.6 mm) −0.00 in. (0.0 mm) |
| 4Hb | 0.06 in. (1.5 mm) | +0.00 in. (0.0 mm) −0.05 in. (1.3 mm) |
| 4Hc | 0.950 in. (24.09 mm) | +0.010 in. (0.3 mm) −0.00 in. (0.0 mm) |
| 4Hd | 0.44 in. ± 0.02 in. (11.2 mm ± 0.5 mm) | |
| 4Aa | 30° ± 2° | |
| 4Ab | 30° ± 2° | |
| 4Ac | 52° ± 2° | |
| 4Ra | 0.22 in. ± 0.02 in. (5.6 mm ± 0.5 mm) | |
| 4Rb | 0.06 in. ± 0.02 in. × 45° (1.5 mm ± 0.5 mm × 45°) | |
| 4Rc | 123.87 in. ± 0.02 in. (3,141.3 mm ± 0.5 mm) | |
| 4Ta | 0.236 in. ± 0.40 in. (6 mm ± 1 mm) | |

In Table 2 and FIG. 4, a capital H in the reference numeral means the reference numeral represents a height. A capital A in the reference numeral means the reference numeral represents an angle. A capital R in the reference numeral means the reference numeral represents a radius. A capital T in the reference numeral means the reference numeral represents a thickness.

FIGS. 5A and 5B are a more detailed example of another embodiment of dome assembly 510 with low profile dome 501. In this embodiment, low profile dome 501 is a first portion of dome assembly 510.

Dome assembly 510 also includes a flange 502, a second portion that is a flange, about low profile dome 501, i.e., flange 502 surrounds low profile dome 501. Flange 502 has an outer circumferential edge surface 502a—an outer wall; an inner circumferential edge surface 502d—an inner wall—, opposite to and removed from outer circumferential edge surface 502a; a first planar edge surface, bottom surface 502b in this embodiment, and a second planar edge surface, top surface 502c in this embodiment, opposite to and removed from first planar surface 502b by a distance 5Hc. In one embodiment, bottom surface 502b has a fine grind finish or better with fire polish. Along the edge of flange 502 were inner wall 502d and bottom surface 502b intersect is formed a lip that is used to protect an O-ring used in sealing dome assembly 510.

A portion 502e of inner circumferential edge surface 502d of flange 502 abuts an edge surface of low profile dome 501. Inner edge surface 502d extends from a predefined distance 5Hb from a top surface 502c to a distance equal to about the thickness of low profile dome 501. Thus, low profile dome 501 is said to be positioned on side wall 502d about adjacent to a top surface of flange 502

First portion 501 is clear quartz. Low profile dome 501 is made of clear quartz so that relatively little of the radiant energy from radiant heat source is absorbed by low profile dome 501, allowing most of the radiant energy to be transmitted through reaction chamber 250 directly to at least one substrate on susceptor 275.

Flange 502 is made of heat shielding opaque quartz. A heat shielding opaque quartz suitable for use in this invention is available from Pyromatics Corp., 3985 Ben Hur Ave., Willoughby, Ohio 54094-6365 USA as Model No. LD-80

Low profile dome 501 is a portion of a sphere having a radius 5Rc above a chord having a length 5Dc, which is the diameter of low profile dome 501. In this embodiment, a height of low profile dome 201 is defined as a distance 5Ha from bottom surface 502b of flange 502 to a highest point of an inner surface of low profile dome 501. Again, a height of low profile dome 501 may be selected from a range of 0.25 inches to 1.5 inches and in the embodiment of Table 3 is 1.24 inches. Similarly, the vertical position of the low profile dome can be moved along the inner wall of the flange based upon empirical analyses of the performance of the RTP reactor vs. the vertical position.

Table 3 presents dimensions for one embodiment of dome assembly 510. All burrs and sharp edges are removed from dome assembly 510. All dimensions and tolerances are interpreted per ASME Y14.5M-1994. In this embodiment, the top and bottom surfaces have a flatness of 0.005 in. (0.13 mm) and a parallelism of 0.010 in. (0.25 mm).

TABLE 3

| Ref. No. | Dimension | |
|---|---|---|
| 5Da | 26.000 in. ± 0.005 in. (659.4 mm ± 0.1 mm) | |
| 5Db | 22.875 in. ± 0.005 in. (580.1 mm ± 0.1 mm) | |
| 5Dc | 22.500 in. ± 0.005 in. (5570.6 mm ± 0.1 mm) | |
| 5Ha | 1.24 in. (31.4 mm) | +0.02 in. (0.5 mm) |
| 5Hb | 0.06 in. (1.5 mm) | +0.03 in. (0.8 mm) −0.00 in. (0.0 mm) |
| 5Hc | 0.950 in. (24.09 mm) | +0.010 in. (0.3 mm) −0.000 in. (0.0 mm) |
| 5Ra | 0.13 in. ± 0.02 in. (3.3 mm ± 0.5 mm) | |
| 5Rb | 0.06 in. ± 0.02 in. × 45° (1.5 mm ± 0.5 mm × 45°) | |
| 5Rc | 123.87 in. ± 0.02 in. (3,141.3 mm ± 0.5 mm) | |
| 5Ta | 0.158 in. ± 0.005 in. (4 mm ± 0.1 mm) to 0.236 in. ± 0.005 in. (6 mm ± 0.1 mm) | |

The thickness of low profile dome 501 is selected from within the range given in Table 3 in one embodiment.

FIG. 5B is an illustration of an alternative embodiment 502A of flange 502. In this embodiment a groove is formed in top surface 502c as presented in Table 4. The groove is used in securing flange 502A so that low profile dome 501 can be affixed to flange 502A.

TABLE 4

| Ref. No. | Dimension |
|---|---|
| 5Dd | 23.04 in ± 0.02 in (584.3 mm ± 0.5 mm) |
| 5Hd | 0.25 in ± 0.02 in (6.3 mm ± 0.5 mm) |
| 5Rd | 0.25 in ± 0.02 in (6.3 mm ± 0.5 mm) |

In Tables 3 and 4 and FIGS. 5A and 5B, a capital H in the reference numeral means the reference numeral represents a height. A capital A in the reference numeral means the reference numeral represents an angle. A capital R in the reference numeral means the reference numeral represents a radius. A capital T in the reference numeral means the reference numeral represents a thickness.

In one embodiment, the quartz liner along sidewall 203, the quartz liner on bottom wall 204, gas ring liner 202 and the skirts are made of clear quartz having a bead-blasted surface facing into reaction chamber 250. The bead-blasted surface causes films deposited on these surfaces to stick to the surfaces rather than to flake-off as would otherwise be the case. Consequently, contamination that results from the flaking is avoided. After prolonged use of reactor 200, these liners and skirts can be removed from reaction chamber 250 and cleaned by, for instance, an acid etch.

Above, various embodiments of the invention have been described. The descriptions are intended to be illustrative, not limitative. Thus, it will be apparent to one skilled in the art that certain modifications may be made to the invention as described without departing from the scope of the claims set out below.

We claim:

1. A rapid thermal process reactor comprising:
   a table top;
   a vessel including:
      a circular bottom wall including a chamber exhaust port;
      a cylindrical sidewall extending from the circular bottom wall and bounding a first part of a rapid thermal processing reaction chamber;
      a low profile dome having a height in a range of 0.25 inches to 1.5 inches, and an inner surface; and
      a flange, surrounding and abutting the low profile dome, having a bottom surface,
         wherein said inner surface is a part of a spherical surface, and the height is the distance from the bottom surface of the flange to the highest point on the inner surface, and
         wherein said inner surface of the low profile dome bounds a second part of the rapid thermal processing reaction chamber in the vessel;
   a rotatable susceptor assembly having a top surface, wherein the top surface is vertically movable and is positionable at a processing position in the rapid thermal processing reaction chamber;
   a gas ring, mounted about the cylindrical sidewall of said vessel, comprising an injector, the injector having a centerline,
      wherein said gas ring is mounted between the table top and the flange, and
      wherein the centerline of the injector is about tangent to the top surface of the rotatable susceptor assembly when the top surface is in the processing position; and
   a radiant heat source mounted outside said vessel and so radiant energy from said radiant heat source passes through said low profile dome, into said rapid thermal processing reaction chamber, to heat at least one substrate for rapid thermal processing.

2. The rapid thermal process reactor of claim 1 further comprising:
   a clamp ring mounted on and around the flange to clamp said dome assembly in place, wherein said clamp ring is external to said rapid thermal processing reaction chamber.

3. The rapid thermal process reactor of claim 2 further comprising:
   a clamp ring shield mounted on said clamp ring, wherein said clamp ring is external to said rapid thermal processing reaction chamber.

4. The rapid thermal process reactor of claim 1 wherein at least one lamp bank of said radiant heat source has a characteristic angle of 10°.

5. A rapid thermal process reactor comprising:
   a table top;
   a vessel bounding a rapid thermal processing reaction chamber, the vessel including:
      a circular bottom wall including a chamber exhaust port;
      a cylindrical sidewall extending from said circular bottom wall, and bounding a first portion the rapid thermal processing reaction chamber; and
      a dome assembly comprising:
         a low profile dome having a height in a range of 0.25 inches to 1.5 inches,
            wherein an inner surface of said low profile dome bounds a second portion of said rapid thermal processing reaction chamber, and
            wherein said inner surface is a part of a spherical surface; and
         a flange surrounding and abutting said low profile dome wherein said flange comprises:
            a top surface positioned outside said rapid thermal processing reaction chamber;
            a bottom surface, removed from and opposite said top surface, wherein the height is the distance from the bottom surface of the flange to a highest point on the inner surface;
            an outer circumferential edge surface connecting said top surface and said bottom surface and positioned outside said rapid thermal processing reaction chamber; and
            an inner edge surface, opposite and removed from said outer circumferential edge, including a portion abutting said low profile dome;
   a gas ring mounted about the cylindrical sidewall of said vessel, wherein said gas ring is mounted between the table top and said flange; and
   a radiant heat source mounted outside said vessel and so radiant energy from said radiant heat source passes through said low profile dome, into said rapid thermal processing reaction chamber, to heat at least one substrate for during rapid thermal processing.

6. The rapid thermal process reactor of claim 5 wherein said bottom surface of said flange includes a notch surface bounding a notch in said flange.

7. The rapid thermal process reactor of claim 6 further comprising:
   a gas ring shield mounted as part of the cylindrical sidewall of said vessel, and having a lip extending into said notch.

8. The rapid thermal process reactor of claim 5 further comprising:
   a gas ring shield mounted as part of the cylindrical sidewall of said vessel, and mounted to shield said gas ring from said reaction chamber.

9. The rapid thermal process reactor of claim 5 further comprising:
   a clamp ring mounted over said top surface of the flange and around the outer circumferential edge surface of the flange to clamp said dome assembly in place, wherein said clamp ring is external to said rapid thermal processing reaction chamber.

10. The rapid thermal process reactor of claim 9 further comprising:

a clamp ring shield mounted on said clamp ring, wherein said clamp ring shield is external to said rapid thermal processing reaction chamber.

11. The rapid thermal process reactor of claim 5 wherein at least one lamp bank of said radiant heat source has a characteristic angle of 10°.

12. The rapid thermal process reactor of claim 5 wherein said portion abutting said low profile dome is positioned about adjacent to said top surface.

13. The rapid thermal process reactor of claim 5 wherein said portion abutting said low profile dome is positioned about adjacent to said bottom surface.

14. A rapid thermal process reactor comprising:
a table top;
a vessel bounding a rapid thermal processing reaction chamber, the vessel including:
  a circular bottom liner including a chamber exhaust port
  a cylindrical sidewall liner defining a first portion of a cylindrical sidewall of the reaction chamber; and
  a dome assembly comprising:
    a low profile dome having a height in a range of 0.25 inches to 1.5 inches,
      wherein an inner surface of said low profile dome bounds a portion of said rapid thermal processing reaction chamber, and
      wherein said inner surface is a part of a spherical surface; and
    a flange surrounding and abutting said low profile dome wherein said flange comprises:
      a top surface positioned outside said rapid thermal processing reaction chamber;
      a bottom surface, removed from and opposite said top surface, wherein the height is the distance from the bottom surface of the flange to a highest point on the inner surface;
      an outer circumferential edge surface connecting said top surface and said bottom surface and positioned outside said rapid thermal processing reaction chamber; and
      an inner edge surface, opposite and removed from said outer circumferential edge, including a portion abutting said low profile dome;
a radiant heat source mounted outside said vessel and so radiant energy from said radiant heat source passes through said low profile dome, into said rapid thermal processing reaction chamber, to heat at least one substrate during rapid thermal processing;
a gas ring mounted about the cylindrical sidewall of said vessel, wherein said gas ring is mounted between the table top and the bottom surface of the flange;
a gas ring liner mounted as a second portion of said cylindrical sidewall of said reaction chamber, and mounted to shield said gas ring from said reaction chamber;
a clamp ring mounted over said top surface of the flange and around the outer circumferential edge surface of the flange to clamp said dome assembly in place, wherein said clamp ring is external to said rapid thermal processing reaction chamber; and
a clamp ring shield mounted on said clamp ring and on the dome assembly, wherein said clamp ring shield is external to said rapid thermal processing reaction chamber.

15. The rapid thermal process reactor of claim 14 wherein said portion abutting said low profile dome is positioned about adjacent to said top surface.

16. The rapid thermal process reactor of claim 14 wherein said portion abutting said low profile dome is positioned about adjacent to said bottom surface.

* * * * *